(12) United States Patent
Richter et al.

(10) Patent No.: US 9,972,721 B1
(45) Date of Patent: May 15, 2018

(54) THICK FDSOI SOURCE-DRAIN IMPROVEMENT

(71) Applicant: GLOBALFOUNDRIES Inc., Grand Cayman (KY)

(72) Inventors: Marcel Richter, Grosskmehlen (DE); Ardechir Pakfar, Dresden (DE); Armin Muehlhoff, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/337,368

(22) Filed: Oct. 28, 2016

(51) Int. Cl.

| | |
|---|---|
| *H01L 21/336* | (2006.01) |
| *H01L 29/786* | (2006.01) |
| *H01L 29/08* | (2006.01) |
| *H01L 27/12* | (2006.01) |
| *H01L 29/66* | (2006.01) |

(52) U.S. Cl.
CPC .... *H01L 29/78654* (2013.01); *H01L 27/1203* (2013.01); *H01L 29/0847* (2013.01); *H01L 29/66492* (2013.01); *H01L 29/66636* (2013.01); *H01L 29/66772* (2013.01)

(58) Field of Classification Search
CPC ............. H01L 21/0475; H01L 27/1203; H01L 29/0847

USPC .......................................................... 438/300
See application file for complete search history.

(56) References Cited

U.S. PATENT DOCUMENTS

| | | | |
|---|---|---|---|
| 2013/0146959 A1* | 6/2013 | Cheng | H01L 29/66181 257/310 |
| 2013/0277750 A1* | 10/2013 | Lai | H01L 23/5228 257/369 |
| 2017/0005196 A1* | 1/2017 | Chen | H01L 29/7848 |

\* cited by examiner

*Primary Examiner* — David S Blum
(74) *Attorney, Agent, or Firm* — Amerson Law Firm, PLLC (57) ABSTRACT

A method of forming a semiconductor device is disclosed including providing a semiconductor-on-insulator substrate comprising a semiconductor bulk substrate, a buried insulating layer positioned on the semiconductor bulk substrate and a semiconductor layer positioned on the buried insulating layer, providing at least one metal-oxide semiconductor gate structure positioned above the semiconductor layer comprising a gate electrode and a spacer formed adjacent to the gate electrode, selectively removing an upper portion of the semiconductor layer so as to define recessed portions of the semiconductor layer and epitaxially forming raised source/drain regions on the recessed portions of the semiconductor layer.

20 Claims, 6 Drawing Sheets

THICK FDSOI SOURCE-DRAIN IMPROVEMENT

BACKGROUND OF THE INVENTION

1. Field of the Invention

Generally, the present disclosure relates to the fabrication of integrated circuits and semiconductor devices, and, more particularly, to forming semiconductor-on-insulator semiconductor devices.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, metal-oxide-semiconductor (MOS) technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. Miniaturization and increase of circuit densities represent ongoing demands.

A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length is a dominant design criterion for accomplishing an increase in the operating speed of the integrated circuits. As the channel length is reduced, the thickness of the gate dielectric is also reduced. The scaling of the gate dielectric is limited by several factors such as defects, power supply voltage, time-dependent dielectric breakdown and leakage currents.

The demand for thinning MOS devices increases the probability of facing problems with so called "hot carriers." Hot carriers are particles, i.e., electrons and/or holes, which acquire sufficiently high kinetic energy due to applying an electric field, i.e., stressing. Having acquired sufficient kinetic energy, these hot carriers may be likely injected and trapped into regions which normally are forbidden regions of the device, e.g., the gate structure dielectrics. This is also termed Hot Carrier Injection (HCI). Having reached these regions, trapping processes may trap these particles there. Also, interface states may be generated. Both trapped particles and interface states may act as electrically charged defects, which may then lead to irreversible degradation of the performance of the MOS devices, such as threshold voltage shifts or conductance degradation of the MOS devices. Hot carrier degradation may be understood as being similar as total dose damage to semiconductors, as experienced in space systems or high energy accelerators due to proton, electron, X-ray and gamma ray exposure. The useful life-time of circuits and integrated circuits based on a MOS device may thus be affected by the life-time of the MOS device itself.

Figure 1A:
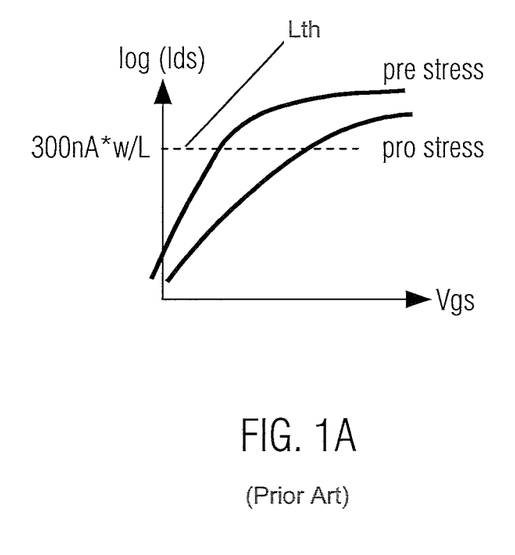
FIGS. 1A and 1B illustrate a current $I_{ds}$ as a function of a voltage $V_{gs}$ for an exemplary prior art semiconductor MOS device.

FIG. 1A illustrates a current $I_{ds}$ as a function of a voltage $V_{gs}$ for an exemplary MOS device. The impact of HCI is shown by the pre-stress and post-stress curves, respectively. Note the logarithmic scale of the ordinate. A threshold line of Lth is indicated. When the Voltage $V_{gs}$ is high enough so the device current reaches the threshold line Lth, it has a value noted Vth, the threshold Voltage. The almost linear part of the respective curve below the horizontal threshold line may be identified as so-called subthreshold slop. Stressing of the device, i.e., electrically stressing the junction, means putting a voltage to the device. The difference between the pre-stress curve and the post-stress curve is clearly visible as is the shift of threshold voltage as the current reaches the line Lth at a higher voltage. The subthreshold slope of the pre-stress curve is much steeper than the subthreshold slope of the post-stress curve. This effect can be attributed to the degradation of the device due to the Hot Carrier Injection. The less steep slope of the post-stress curve also means that a higher voltage $V_{gs}$ is necessary to overcome the threshold. Thus, FIG. 1A illustrates one example of considerable threshold shifts and thereby degradation of the MOS device.

Figure 1B:
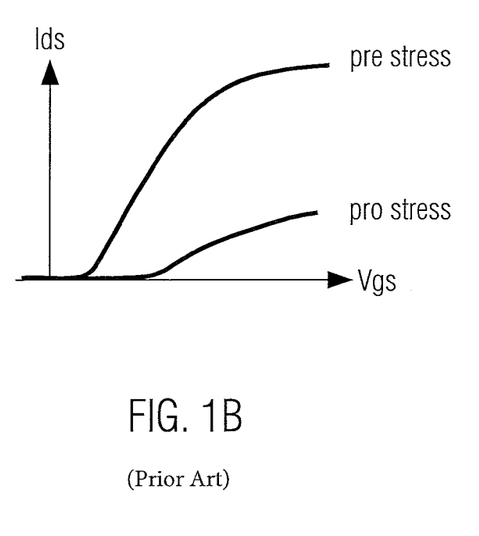

FIG. 1B illustrates similar curves as in FIG. 1A for an exemplary MOS device, but now using a linear scale for the ordinate. The huge difference between the pre-stress and the post-stress curve may be attributed to a huge degradation of device key parameters, i.e., increase of the so-called on resistance $R_{on}$.

As indicated in FIGS. 1A and 1B, the symptoms of degradation by Hot Carrier Injection may be a considerable threshold shift (FIG. 1A), a considerable $R_{on}$ degradation (FIG. 1B), mobility degradation, subthreshold slope degradation (FIG. 1A). Hot carriers, such as electrons or holes, may be trapped at high temperature oxide interfaces, high temperature oxide to bulk interfaces, silicon nitride interfaces, or nitride bulk. The life-time of the devices will be shortened and their characteristics will degrade.

As alternative to the standard silicon wafers commonly used in advanced integrated circuits, semiconductor-on-insulator (SOI) wafers (such as a silicon-on-insulator wafer) can be used for the improved electrical characteristics of an additional isolation from the oxide layer that is placed between the surface active semiconductor film to the silicon substrate beneath. The surface active semiconductor film may have different thicknesses depending on the application and may also be thinned down to a few nanometers in order to allow a full depletion of the channel area beneath the gate structure and take advantage of additional physical effects improving the MOS device parameters. This is then called Fully-Depleted Semiconductor-on-Insulator (FDSOI) devices.

Figure 2:
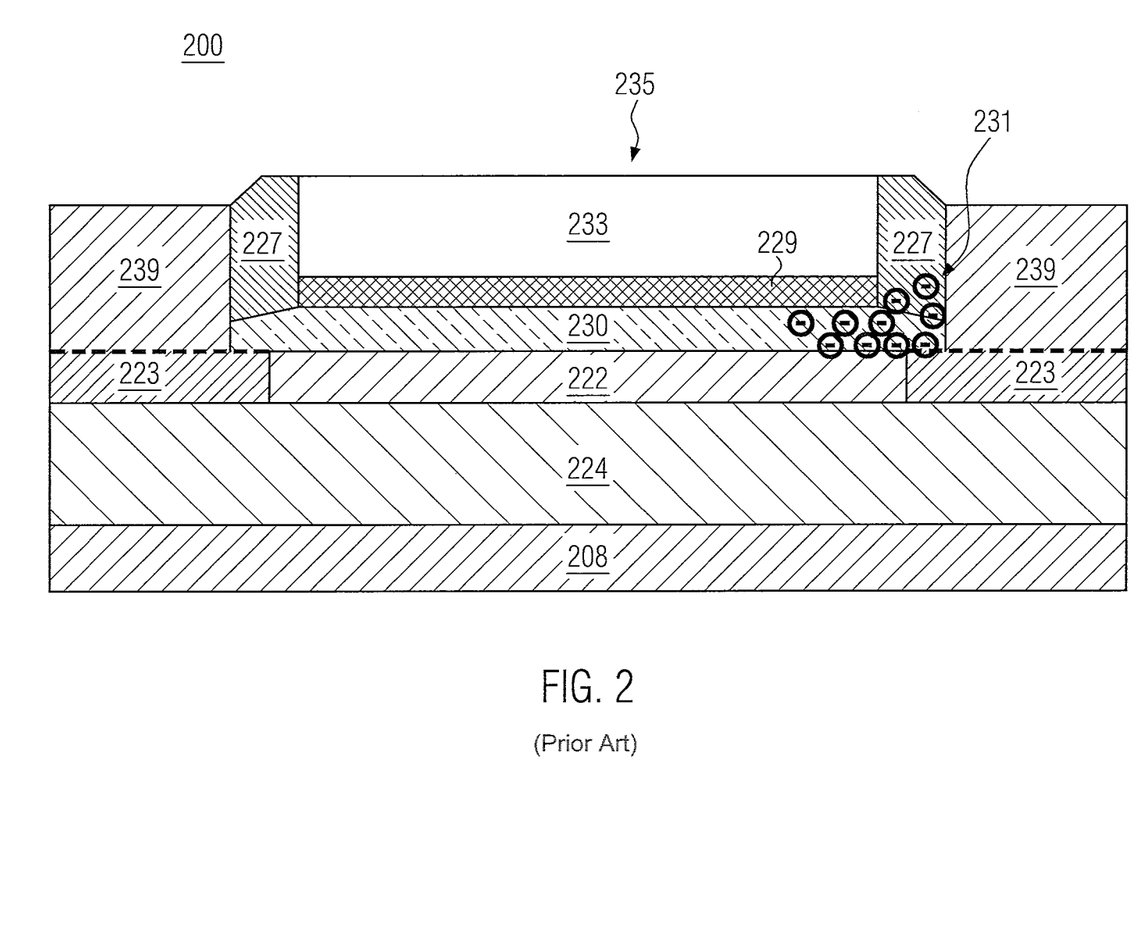
FIG. 2 illustrates a prior art semiconductor MOS device.

FIG. 2 illustrates an example of a standard MOS device 200 for which issues as discussed with regard to FIGS. 1A and 1B are likely to occur due to hot carrier injection. FIG. 2 illustrates a semiconductor device 200. The semiconductor device 200 of FIG. 2 comprises a semiconductor bulk substrate 208 and a buried insulating layer (e.g., oxide) layer 224 formed on the semiconductor bulk substrate 208. A semiconductor layer formed 222 is formed on the buried insulating layer 224. A gate structure 235 is formed on the semiconductor layer 222. The gate structure 235 comprises a high temperature oxide layer 230, a metal gate layer 229 and a polysilicon layer 233. A spacer 227 is formed on either side of the gate structure, i.e., in a direction vertical and perpendicular to the semiconductor layer 222.

FIG. 2 illustrates hot carriers, here electrons, 231 which are shown not to scale. FIG. 2 merely illustrates that these electrons 231 may be generated and then injected into interface regions between the semiconductor layer 222 and the layers 230 and/or 227, respectively. These electrons may lead to irreversible degradation effects as discussed with respect to FIGS. 1A and 1B. FIG. 2 further illustrates raised source/drain regions 239 formed above the semiconductor layer 222. Regions 223 of the semiconductor layer 222 are those regions which are covered by the raised source/drain regions 239. Since the raised source/drain regions 239 typically are doped by a dopant, e.g., boron ions in PMOS devices, these boron ions may migrate into the regions 223 due to diffusion processes such as out-diffusion from the regions 239. Thereby, modified regions 223 are generated which comprise some amount of dopant ions migrated from the region 239. As indicated in FIG. 2, the electrons 231 may also influence interface regions between regions 223 and the layer 230, as well as regions 239.

To assure that integrated circuits manufactured with minimal geometry devices will not have their useful life impaired, the life-time of the component MOS devices must have their HCI degradation sufficiently well understood and in particular sufficiently controlled. To minimize the effects of hot carrier degradation in MOS devices, device design modification may be made. These are, for example, larger channel lengths, double diffusion of source and drain, and graded drain junctions by ion implantation. Thus, another approach to react to the above problem may be to increase the thickness of the spacers 227, as discussed above.

In FDSOI technology, the impact of the charged defects induced by Hot-Carrier-Injection is increased by the reduced thickness of the channel 222 and the close proximity of the current lines with the defects created in layer 230.

Often, in addition to increasing the thickness of the spacers 227, also the thickness of the semiconductor layer 222 of FIG. 2, i.e., the thickness of the SOI film, may be increased by a few nanometers, in order to increase the thickness of the MOS device channel and allow current lines to avoid the proximity of the defects created in layer 230 while still keeping the degradation tolerable.

Figure 3:
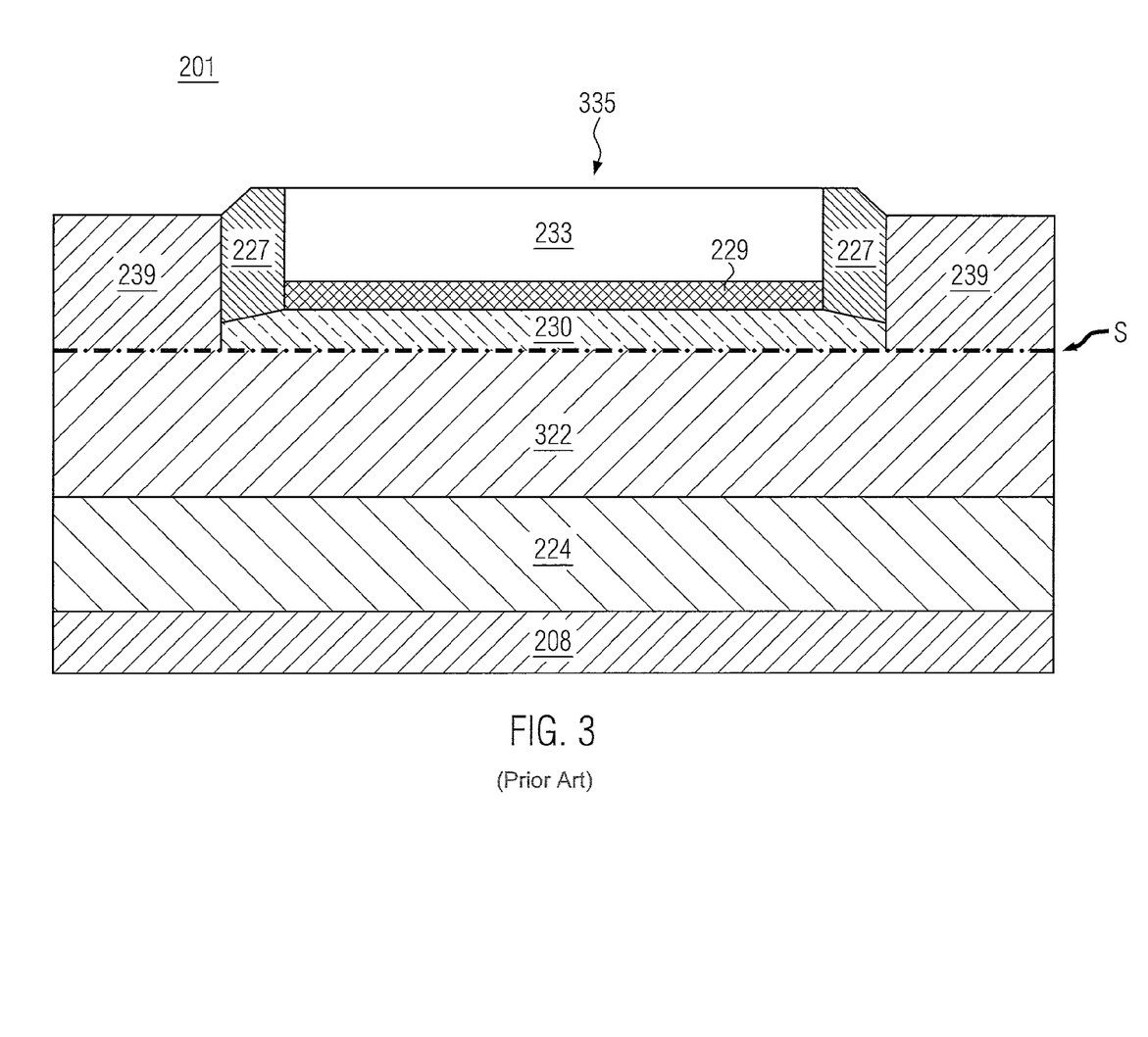
FIG. 3 illustrates a similar prior art semiconductor device as in FIG. 2 having a relatively thicker semiconductor layer.

FIG. 3 illustrates a modified semiconductor device 201 as compared to the semiconductor device 200 of FIG. 2. As illustrated in FIG. 3, the thickness of the semiconductor layer 322 of FIG. 3 is much larger than the thickness of the semiconductor layer 222 of FIG. 2. FIG. 3 also illustrates a gate structure 335 which may be similar or even identical to the gate structure 235 of FIG. 2. Here, the same elements are denoted by the same reference numbers.

FIG. 3 illustrates that raised source/drain regions 239 are formed on the thicker semiconductor layer 322. The dashed line S of FIG. 3 indicates the surface of the semiconductor layer 322, the surface facing away from the bulk substrate 208. Epitaxially formed raised source/drain regions 239 are formed directly on the surface of the semiconductor layer 322 outside a gate structure 335. The gate structure 335 may be substantially similar or the same as the gate structure 235 in FIG. 2. As discussed already for FIG. 2, the raised source/drain regions 239 may comprise dopant ions such as boron ions. Then, dopant ions from the epitaxially raised source/drain regions may out-diffuse into parts of the thick undoped semiconductor layer 323. The out-diffusion process of boron ions from the raised source/drain regions 239 is indicated by arrows 325 in FIG. 4. As indicated in FIG. 4, due to the diffusion, surface near regions 323 of the thick semiconductor layer 322 are created in which the thick semiconductor layer 322 is doped with the boron ions.

Thus, whereas the thick semiconductor layer 322 being thicker than the semiconductor layer 222 of FIG. 2 may counteract some of the effects of HCI, due to the diffusion of the dopant from the epitaxial source/drain regions 239, the access resistance of the device 201 may actually increase and it may thus degrade performance. Thus, additional degraded performance may need to be compensated for by ion implantation. However, an additional, i.e., separate, ion implantation may likely introduce implantation defects.

Figure 4:
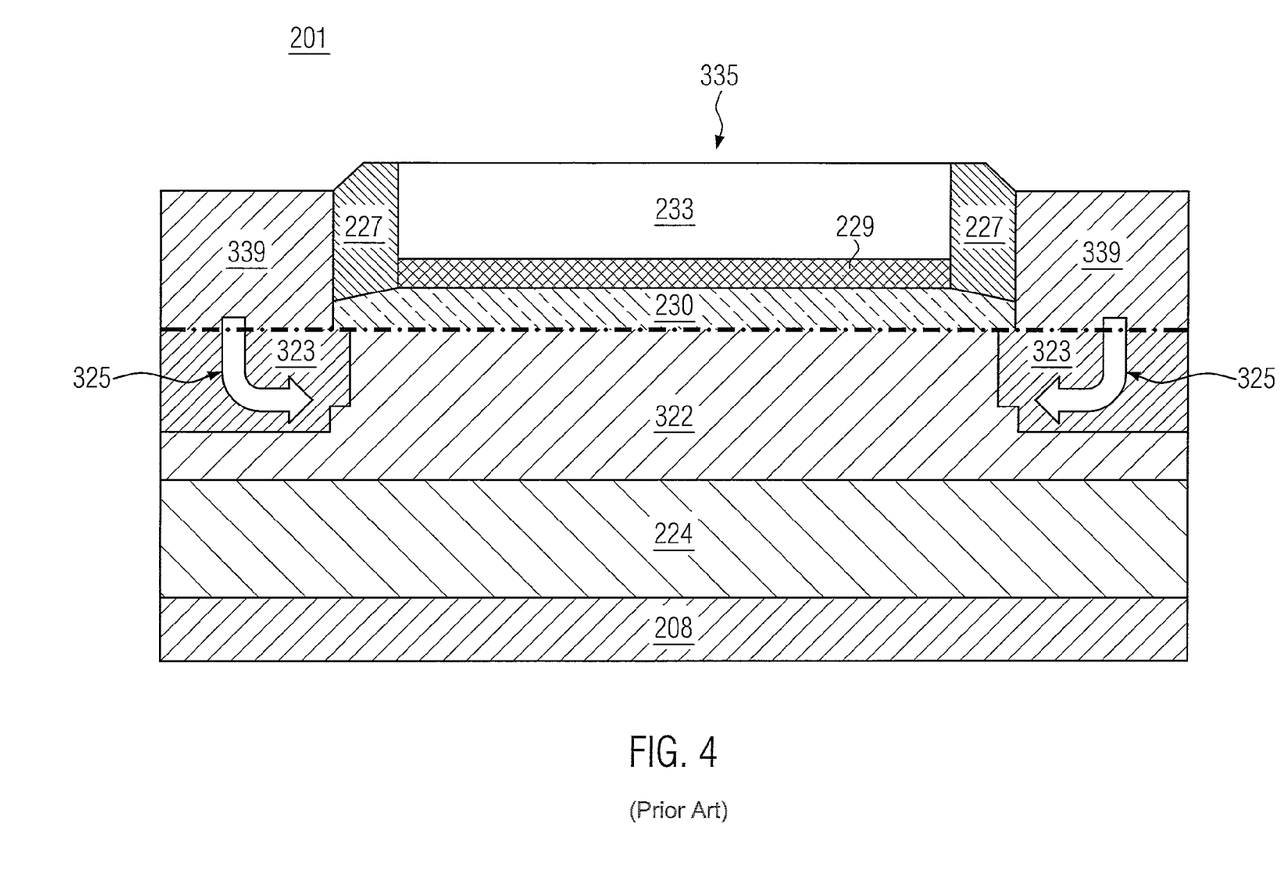
FIG. 4 illustrates the prior art semiconductor device according to FIG. 3 after diffusing of dopants.

In view of the above, the present disclosure provides an alternative approach to the standard solution of FIG. 4. The present disclosure is targeted on FDSOI transistors. FDSOI utilizes raised source/drain epitaxy processes to form the source and drain regions by out-diffusion. In order to form a lower doped extension region, one could implant, as in previous technologies, with a thin solid spacer. As it is well known, that implanted SOI will have defects and epitaxial growth of raised source/drain will be inhibited or degraded, as a perfect silicon or silicon germanium crystal is needed as a starting point. If the extension implant, however, is moved to after spacer and epitaxy formation, very high energies and tilt angles would be needed to reach down to the channel area. This in turn would damage again the whole structure heavily, including the raised source/drain areas, inducing transient enhanced dopant diffusion effects and a lower control and scalability of the MOS devices. The present disclosure targets to solve these issues by providing an alternative step for the process flow.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to semiconductor devices and methods for manufacturing semiconductor devices wherein enhanced transistor performance may be obtained for N-channel transistors and P-channel transistors on the basis of Fully Depleted Semiconductor-on-Insulator (FDSOI) techniques.

The present disclosure discloses a method of forming a semiconductor device including providing a semiconductoron-insulator (SOI) substrate comprising a semiconductor bulk substrate, a buried insulating layer (e.g., oxide) positioned on the semiconductor bulk substrate and a semiconductor layer positioned on the buried insulating layer, providing at least one metal-oxide semiconductor gate structure over the semiconductor layer comprising a gate electrode and a spacer formed adjacent to the gate electrode, selectively removing an upper portion of the thick semiconductor layer so as to define recessed portions of the semiconductor layer, the upper portion facing away from the bulk substrate, and epitaxially forming raised source/drain regions on the recessed portions of the semiconductor layer.

In this method, a removing step, such as a selective etching process, is performed before the source/drain regions are formed. Thereby, the dopant diffusion from the source and drain layers is optimized and the series resistance of the MOS device may be improved. This method provides for better compatibility and integration of the thicker FDSOI device with a thin FDSOI device on the same wafer.

Furthermore, a semiconductor device is provided including a semiconductor-on-insulator (SOI) substrate comprising a semiconductor bulk substrate, a buried insulating layer positioned on the semiconductor bulk substrate and a semiconductor layer positioned on the buried insulating layer, at least one metal-oxide semiconductor gate structure positioned above the semiconductor layer comprising a gate electrode and a spacer formed adjacent to the gate electrode, the semiconductor layer having recessed portions formed in an upper portion of the semiconductor layer not covered by the metal-oxide semiconductor gate structure and raised source/drain regions positioned in and above the recessed portions of the semiconductor layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As used herein, spatial references "top," "bottom," "upper," "lower," "vertical," "horizontal" and the like may be used for convenience when referring to structures of FET devices. These references are intended to be used in a manner consistent with the drawings only for teaching purposes, and are not intended as absolute references for FET structures. For example, FETs may be oriented spatially in any manner different from the orientations shown in the drawings. "Vertical" is used to refer to a direction normal to the semiconductor layer surface, and "horizontal" is used to refer to a direction parallel to the semiconductor layer surface when referring to the drawings. "Upper" is used to refer to a vertical direction away from the semiconductor layer. An element positioned "above" ("below") another one is located farther away from (closer to) the semiconductor layer surface as compared to the other one.

As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices etc., in principle. The techniques and technologies described herein can be utilized to fabricate MOS integrated circuit devices, including NMOS integrated circuit devices, PMOS integrated circuit devices, and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor bulk substrate.

Figure 5:
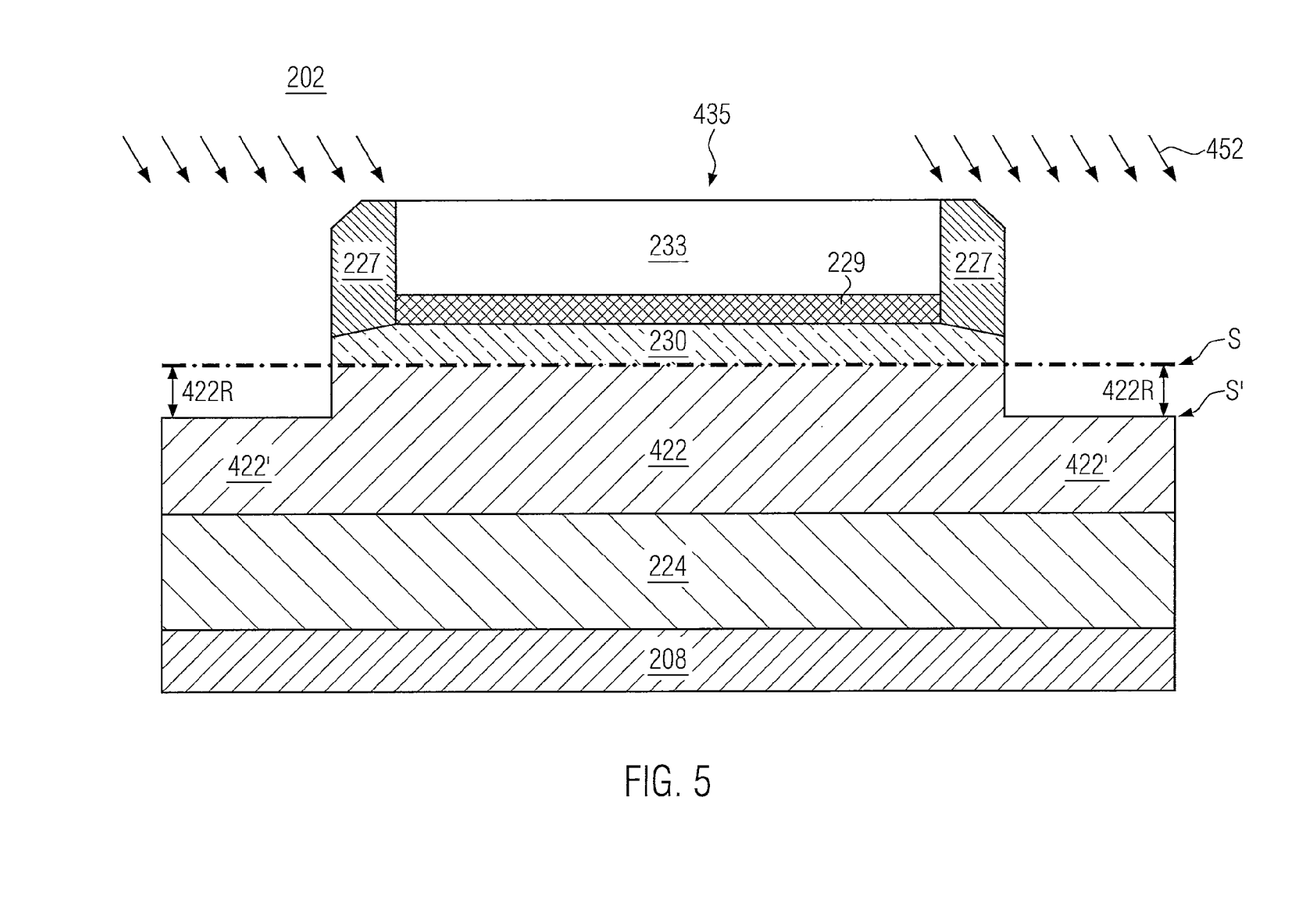
FIG. 5 illustrates a semiconductor device similar to the semiconductor device of FIG. 2 after a process flow step according to the present disclosure.

Starting from a semiconductor device similar to the semiconductor 201 of FIG. 4, FIG. 5 illustrates a novel semiconductor device 202 disclosed herein. In FIG. 5, a specific step 452 of the process flow is shown. The specific process flow step 452 is carried out after forming the semiconductor device 202. That is, it is carried out after providing the semiconductor-on-insulator (SOI) substrate comprising the semiconductor bulk substrate 208, the buried insulating layer (e.g., oxide) layer 224 provided on the semiconductor bulk substrate 208 and providing the relatively thick semiconductor layer 422 on the buried insulating layer 224 having an initial thickness. Here the thick semiconductor layer 422 may be similar or identical to the thick semiconductor layer 322 of FIG. 3. Also, at least one metal-oxide semiconductor gate structure 435 is provided over the semiconductor layer 422 comprising a gate electrode and a spacer 227 formed adjacent to the gate electrode. Here, the gate structure may comprise a high temperature oxide layer 230 and a metal gate layer 229 positioned on the high temperature layer 230, as well as a polysilicon layer 233 positioned on the metal gate layer 229. The material of the spacer 227 may comprise silicon nitride. Further, the metal-oxide semiconductor gate structure 435 may be an N-type metal-oxide semiconductor gate structure or a P-type metal-oxide semiconductor gate structure. In case the gate structure 435 is an N-type metal-oxide semiconductor gate structure, the semiconductor layer 422 may be a crystalline silicon layer. In case the gate structure 435 is a P-type metal-oxide semiconductor structure, the semiconductor layer 422 may comprise silicon-germanium material. Also, in one embodiment, the metal-oxide semiconductor gate structure 435 further comprises a high temperature oxide layer 230 positioned on the semiconductor layer 422, a metal gate layer 229 positioned atop of the high temperature oxide layer 230 and a polysilicon layer 233 positioned atop of the metal gate layer 229. The spacer 227, as shown in FIGS. 5 and 6, is positioned adjacent to the metal gate layer 229 and the polysilicon layer 233, and the spacer is positioned on the high temperature oxide layer 230.

The specific process flow step 452 selectively removes an upper portion 422R of the thick semiconductor layer 422, the upper portion 422R facing away from the bulk substrate 208. In other words, by removing the upper portion 422R, a recess, which may also be termed 422R, is formed at the surface S of the semiconductor layer 422. Thus, in the region where the recess is formed, wherein the initial thickness of the semiconductor layer 422 is reduced to the minimum needed for the selective epitaxial growth to be performed and a reduced region 422' of the initial semiconductor layer 422 is formed having a surface S' facing away from the bulk substrate 208. The surface S' of the reduced region 422' is then below the surface S, or in other words S' of 422' is closer to the bulk substrate 208 than S of layer 422. The specific process flow step 452 may be a dry etching step or a wet etching step or a combination of a dry etching step and a wet etching step.

Figure 6:
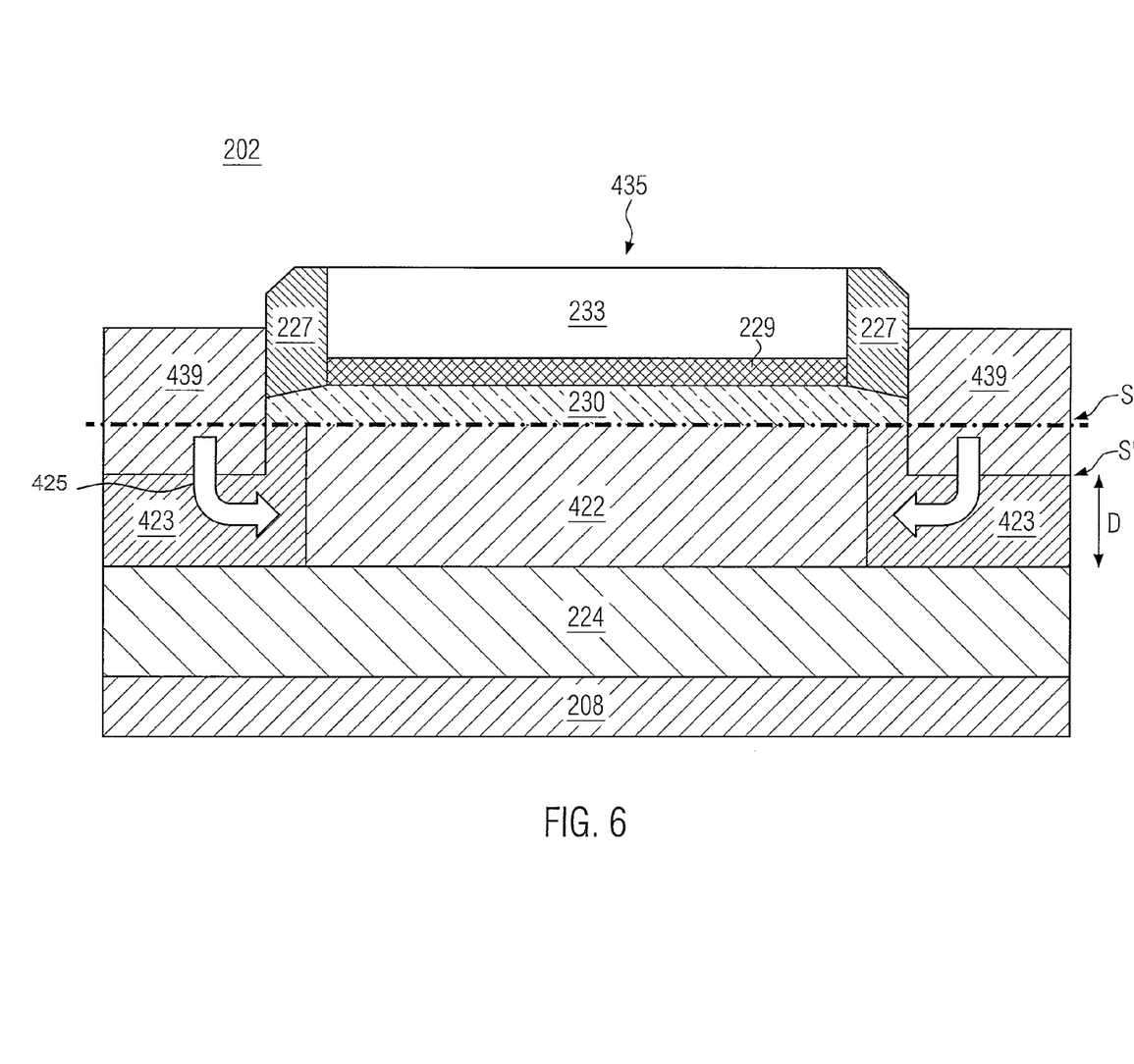
FIG. 6 illustrates the semiconductor device as shown in FIG. 5 after a further process flow step according to the present disclosure.

FIG. 6 further illustrates that the specific process flow step 452 of FIG. 5 is then followed by epitaxially forming raised source/drain regions on the semiconductor layer 422. The epitaxially formed raised source/drain regions 439 are formed on the reduced regions 422' of the semiconductor layer 422 (see FIG. 5) on which the upper portion 422R has been removed by the removing step 452. Thus the raised source/drain material of regions 439 also fills the recess 422R which was shown in FIG. 5. Thus the raising of the source/drain regions 439 starts on the surface S' below the surface S (see the relation of the surfaces S and S' as discussed for FIG. 5).

The forming of the raised source/drain regions 439 of FIG. 6 may comprise adding boron ions during the step of forming the raised source/drain regions 439. Additionally or alternatively, an additional ion implantation step may be performed immediately following the raising step, thereby implanting boron ions into the already formed raised source/drain regions 439. In the standard prior art technology, no ion implantation is performed and the dopants come only from the epitaxial N and P selectively epitaxial source and drain. Ion implantation can be used as a method to lower the impact of HCI by smoothing the junction. As is shown in FIG. 6, the raised source/drain regions 439 are formed adjacent to the spacer 227.

FIG. 6 further illustrates arrow 425 depicting an out-diffusion process of the boron ions from the raised source/drain regions 439 into the regions 422' (FIG. 5) of the semiconductor layer 422, thereby creating doped semiconductor regions 423. Unlike prior art devices, due to the reduced thickness of the regions 422' of FIG. 5, regions 423 will now be doped through their respective entire thickness D, as shown in FIG. 6. This will substantially improve the series resistance of the junction and avoid an additional ion implantation step.

The process step as illustrated in FIGS. 5 and 6 may further be followed by a subsequent annealing step for controlling and accelerating out-diffusion of the implanted boron ions into the thick semiconductor layer 422, e.g., the regions 422'. Moreover, an additional lightly doped drain (LDD) implantation process may be performed after the step of epitaxially forming raised source/drain regions for implanting further dopants.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a semiconductor device, comprising:
    providing a semiconductor-on-insulator substrate comprising a semiconductor bulk substrate, a buried insulating layer positioned on said semiconductor bulk substrate and a semiconductor layer positioned on said buried insulating layer, said semiconductor layer having an initial thickness;
    forming at least one metal-oxide semiconductor gate structure above said semiconductor layer comprising a gate electrode and a spacer formed adjacent to said gate electrode;
    selectively removing an upper portion of said semiconductor layer so as to thereby define recessed portions of said semiconductor layer;
    epitaxially forming raised source/drain regions on said recessed portions of said semiconductor layer; and
    performing an annealing step so as to cause out-diffusion of dopant ions in said raised source/drain regions into said semiconductor layer to define doped semiconductor regions in portions of said semiconductor layer disposed beneath said raised source/drain regions, said doped semiconductor regions directly contacting said raised source/drain regions and said buried insulating layer.

2. The method of claim 1, wherein said initial thickness of said semiconductor layer is at least 5 nm.

3. The method of claim 1, wherein selectively removing said upper portion of said semiconductor layer comprises a performing at least one of a dry etching step or a wet etching step.

4. The method of claim 1, wherein said raised source/drain regions are formed adjacent to said spacer.

5. The method of claim 4, further comprising performing a lightly doped drain implantation process after forming said raised source/drain regions.

6. The method of claim 1, wherein said spacer comprises silicon nitride.

7. The method of claim 1, wherein said metal-oxide semiconductor gate structure is an N-type metal-oxide semiconductor gate structure or a P-type metal-oxide semiconductor gate structure.

8. The method of claim 7, wherein, for an N-type metal-oxide semiconductor gate structure, said semiconductor layer is a crystalline silicon layer, and wherein, for a P-type metal-oxide semiconductor structure, said semiconductor layer comprises a silicon-germanium material.

9. The method of claim 1, wherein said metal-oxide semiconductor gate structure further comprises a high temperature oxide layer positioned on said semiconductor layer, a metal gate layer positioned on said high temperature oxide layer and a polysilicon layer positioned on said metal gate layer.

10. The method of claim 9, wherein said spacer is provided adjacent to said metal gate layer and said polysilicon layer, and said spacer is positioned on said high temperature oxide layer.

11. The method of claim 1, wherein said semiconductor-on-insulator substrate is a fully depleted silicon-on-insulator substrate.

12. A method of forming a semiconductor device, comprising:
    providing a semiconductor-on-insulator substrate comprising a semiconductor bulk substrate, a buried insulating layer positioned on said semiconductor bulk substrate and a semiconductor layer positioned on said buried insulating layer, said semiconductor layer having an initial thickness;
    forming at least one metal-oxide semiconductor gate structure above said semiconductor layer comprising a gate electrode and a spacer formed adjacent to said gate electrode;
    selectively removing an upper portion of said semiconductor layer so as to thereby define recessed portions of said semiconductor layer;
    epitaxially forming raised source/drain regions on said recessed portions of said semiconductor layer;
    implanting dopant ions into said raised source/drain regions; and
    performing an annealing step so as to cause out-diffusion of said implanted dopant ions in said raised source/drain regions into said semiconductor layer to define doped semiconductor regions in portions of said semiconductor layer disposed beneath said raised source/drain regions, said doped semiconductor regions directly contacting said raised source/drain regions and said buried insulating layer.

13. The method of claim 12, wherein said initial thickness of said semiconductor layer is at least 5 nm.

14. The method of claim 12, wherein selectively removing said upper portion of said semiconductor layer comprises performing at least one of a dry etching step or a wet etching step.

15. The method of claim 12, wherein said raised source/drain regions are formed adjacent to said spacer.

16. The method of claim 15, further comprising performing a lightly doped drain implantation process after forming said raised source/drain regions.

17. The method of claim 12, wherein said metal-oxide semiconductor gate structure is an N-type metal-oxide semiconductor gate structure or a P-type metal-oxide semiconductor gate structure.

18. The method of claim 17, wherein, for an N-type metal-oxide semiconductor gate structure, said semiconductor layer is a crystalline silicon layer, and wherein, for a P-type metal-oxide semiconductor structure, said semiconductor layer comprises a silicon-germanium material.

19. The method of claim 12, wherein said metal-oxide semiconductor gate structure further comprises a high temperature oxide layer positioned on said semiconductor layer, a metal gate layer positioned on said high temperature oxide layer and a polysilicon layer positioned on said metal gate layer.

20. The method of claim 19, wherein said spacer is provided adjacent to said metal gate layer and said polysilicon layer, and said spacer is positioned on said high temperature oxide layer.

* * * * *